(12) United States Patent
Cheng et al.

(10) Patent No.: US 12,740,337 B2
(45) Date of Patent: Sep. 15, 2026

(54) PHASE CHANGE MEMORY CELL WITH HEATER

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Arthur Roy Gasasira, Halfmoon, NY (US); Ruilong Xie, Niskayuna, NY (US); Julien Frougier, Albany, NY (US); Min Gyu Sung, Latham, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 689 days.

(21) Appl. No.: 18/047,290

(22) Filed: Oct. 18, 2022

(65) Prior Publication Data

US 2024/0130256 A1 Apr. 18, 2024

(51) Int. Cl.
*H10N 70/00* (2023.01)

(52) U.S. Cl.
CPC ......... *H10N 70/841* (2023.02); *H10N 70/063* (2023.02)

(58) Field of Classification Search
CPC .................................................... H10N 70/841
See application file for complete search history.

(56) References Cited

U.S. PATENT DOCUMENTS

| | | | |
|---|---|---|---|
| 6,545,903 | B1 | 4/2003 | Wu |
| 6,579,760 | B1 | 6/2003 | Lung |

(Continued)

FOREIGN PATENT DOCUMENTS

| | | | |
|---|---|---|---|
| CN | 101000944 | A | 7/2007 |
| WO | 2019/087050 | A1 | 5/2019 |
| WO | 2023/066643 | A1 | 4/2023 |

OTHER PUBLICATIONS

Notification of Transmittal of the International Search Report and the Written Opinion of the International Searching Authority, or the Declaration, Date of mailing Jan. 4, 2024, Applicant's or agent's file reference F23W4739, International application No. PCT/CN2023/124856, 8 pages.

(Continued)

*Primary Examiner* — Leonard Chang
*Assistant Examiner* — Hajar Kolahdouzan
(74) *Attorney, Agent, or Firm* — Yuanmin Cai

(57) ABSTRACT

Embodiments of present invention provide a method of forming a phase change memory device. The method includes forming a bottom electrode on a supporting structure; forming a first blanket dielectric layer, a phase-change material layer, a second blanket dielectric layer, and a hard mask sequentially on top of the bottom electrode; forming an inner spacer in an opening in the hard mask to modify the opening; extending the opening into the second blanket dielectric layer to create an extended opening; filling the extended opening with a heating element; etching the second blanket dielectric layer, the phase-change material layer, and the first blanket dielectric layer respectively into a second dielectric layer, a phase-change element, and a first dielectric layer; forming a conductive liner surrounding the phase-change element; and forming a top electrode on top of the (Continued)

heating element. A structure formed thereby is also provided.

14 Claims, 14 Drawing Sheets

(56) References Cited

U.S. PATENT DOCUMENTS 7,463,512 B2 12/2008 Lung
8,080,439 B2 12/2011 Martinez, Jr.
8,269,208 B2 9/2012 Czubatyj et al.
8,493,772 B2 7/2013 Liu
8,497,182 B2 7/2013 Lung
9,660,188 B2 5/2017 Lin
10,763,307 B1* 9/2020 Carta .................. H10N 70/068
2007/0290185 A1* 12/2007 Wang .................. H10N 70/231 257/3
2008/0090400 A1 4/2008 Cheek
2008/0179585 A1 7/2008 Hsu
2010/0163828 A1 7/2010 Tu
2010/0288993 A1 11/2010 Rho
2013/0292847 A1* 11/2013 Choi .................... H01L 23/528 257/774
2014/0252294 A1 9/2014 Brightsky
2014/0369113 A1 12/2014 Krebs et al.
2019/0181335 A1 6/2019 Oh et al.
2020/0066337 A1* 2/2020 Ok ...................... H10N 70/066
2021/0249593 A1 8/2021 Lai
2022/0302377 A1 9/2022 Li et al.
2023/0397510 A1* 12/2023 Li ....................... H10N 70/066

OTHER PUBLICATIONS

German Patent and Trademark Office, " Office Action," Feb. 27, 2026, 09 Pages, DE Application No. 112023004373.6.

* cited by examiner

PHASE CHANGE MEMORY CELL WITH HEATER

BACKGROUND

The present application relates to manufacturing of semiconductor integrated circuits. More particularly, it relates to a phase change memory device with a heating element and method of manufacturing the same.

Phase change memory has recently emerged as a viable technology for memory application and analog computing. In a typical phase change memory (PCM) device such as, for example, a cross-point PCM device, each memory cell includes a storage element and a selector. The storage element is a PCM cell, and the PCM cell may be programmed through melting, quenching, and/or recrystallization. A heater or heating element is generally used in the process of programming the PCM cell.

In the currently existing art, the PCM cell is usually placed on top of a bottom heater or heating element. In the conventional lateral PCM cell integration process, The PCM cell at the top and the heater or heating element at the bottom are usually patterned at different stages. Due to the inevitable overlay error or misalignment between the step of patterning the bottom heater and the step of patterning the top PCM cell in particular the phase-change element layer, and in the case that the PCM cell is in a circular shape, the heater is not always located at the center of the PCM cell. In other words, the heater and the PCM cell may not be formed concentric. The non-concentric placement of the heating element and the PCM cell may cause, for example and among other deficiencies, non-uniform distribution of the programming current, which could result in degraded and sometimes unpredictable performance of the PCM device. Moreover, this conventional integration process introduces cell-to-cell variability in the PCM device. U.S. Pat. No. 7,463,512 to Lung offers some perspectives of a PCM cell based on the conventional lateral PCM cell integration process.

SUMMARY

Embodiments of present invention provide a phase change memory (PCM) device. The PCM device includes a bottom electrode; a first dielectric layer on top of the bottom electrode; a phase-change element on top of the first dielectric layer; a heating element on top of the phase-change element; a top electrode on top of the heating element; and a conductive liner surrounding at least the phase-change element, wherein the heating element is at a substantial center of the phase-change element with equal horizontal distance to the conductive liner surrounding the phase-change element. The equal horizontal distance from the heating element to the edge of the phase-change element offers substantially uniform conductivity and thus uniform distribution of programming current during the PCM device operation.

In one embodiment, the heating element is surrounded by a second dielectric layer and by a third dielectric layer, the third dielectric layer being on top of the second dielectric layer and materially different from the second dielectric layer.

In another embodiment, the second and third dielectric layers have respective outer sidewalls that align with each other and substantially align with the phase-change element.

In yet another embodiment, the conductive liner covers at least a lower portion of the outer sidewall of the second dielectric layer.

In one embodiment, the PCM device further includes a resistive liner on top of the phase-change element, the resistive liner being below the heating element and the second dielectric layer and surrounded by the conductive liner. The resistive liner offers a less resistive path for a read current when, during a RESET state, at least part of the phase-change element may be in a high resistance state or experience resistance drift due to its amorphous form.

In another embodiment, the bottom electrode is a part of a metal level M and the top electrode is a part of a metal level M+1 in a back-end-of-line (BEOL) structure, and the metal level M and the metal level M+1 are two adjacent metal levels.

Embodiments of present invention also provide a method of forming a phase change memory device. The method includes forming a bottom electrode on a supporting structure; forming a first blanket dielectric layer, a phase-change material layer, a second blanket dielectric layer, and a hard mask sequentially on top of the bottom electrode, the hard mask having an opening that exposes a portion of the second blanket dielectric layer; forming an inner spacer in the opening to create a modified opening; extending the modified opening into the second blanket dielectric layer to create an extended opening; filling the extended opening with a heating element; etching the second blanket dielectric layer, the phase-change material layer, and the first blanket dielectric layer respectively into a second dielectric layer, a phase-change element, and a first dielectric layer; forming a conductive liner surrounding at least the phase-change element; and forming a top electrode on top of the heating element. By forming the heating element in the extended opening created or derived from the inner spacer, the heating element possesses a substantially identical distance to the outer edge or sidewall of the inner spacer.

In one embodiment, etching the second blanket dielectric layer, the phase-change material layer, and the first blanket dielectric layer includes removing the hard mask surrounding the inner spacer; and etching the second blanket dielectric layer, the phase-change material layer, and the first blanket dielectric layer to expose the bottom electrode in an anisotropic etching process by using the inner spacer and the heating element as an etch mask. Using the inner spacer as an etch mask ensures that the heating element have a substantially identical distance to the outer edge or sidewalls of the phase-change element and the conductive liner surrounding the phase-change element.

In another embodiment, extending the modified opening into the second blanket dielectric layer includes etching the second blanket dielectric layer in an anisotropic etching process by using the inner spacer as an etch mask.

In one embodiment, the method further includes forming a resistive liner layer above the phase-change material layer before forming the second blanket dielectric layer, thereby the resistive liner layer being between the phase-change material layer and the second blanket dielectric layer.

In another embodiment, forming the inner spacer includes depositing a conformal spacer layer covering a top surface of the hard mask and a sidewall of the opening of the hard mask; and subsequently removing horizontal portions of the conformal spacer layer in an anisotropic etching process.

In yet another embodiment, forming the conductive liner includes forming a conductive liner layer covering a top surface of the heating element, a top surface of the inner spacer, a sidewall of the inner spacer, a sidewall of the second dielectric layer, a sidewall of the phase-change element, and a sidewall of the first dielectric layer, and a top surface of the bottom electrode; removing horizontal portions of the conductive liner layer in an anisotropic etching process; and removing at least a portion of the conductive liner layer covering the sidewall of the inner spacer.

BRIEF DESCRIPTION OF THE DRAWINGS

The present invention will be understood and appreciated more fully from the following detailed description of embodiments of present invention, taken in conjunction with accompanying drawings of which.

Figure 1:
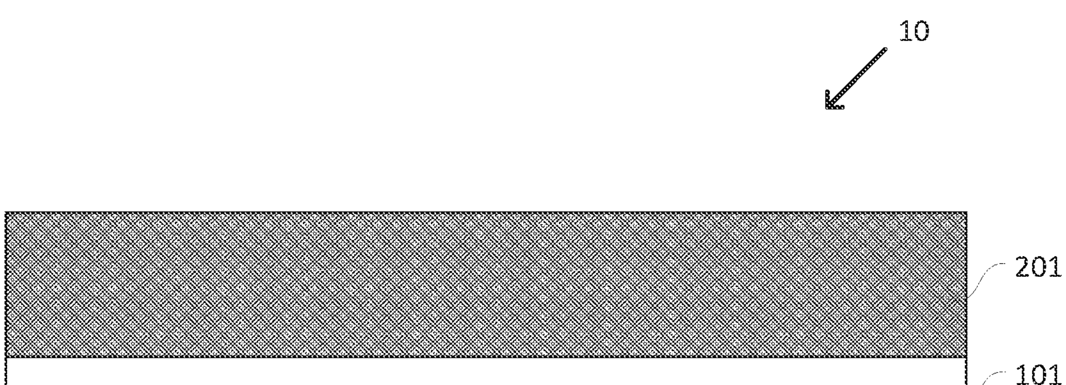
FIG. 1 is a demonstrative illustration of a cross-sectional view of a PCM device in a step of manufacturing thereof according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of a cross-sectional view of a PCM device in a step of manufacturing thereof according to one embodiment of present invention. More particularly, in manufacturing a PCM device 10 (see FIG. 13 for more details), embodiments of present invention provide receiving a supporting structure 101 such as, for example, a semiconductor substrate or a back-end-of-line (BEOL) structure on a semiconductor substrate, thereupon or therewithin there may be formed other active and/or passive semiconductor devices such as, for example, transistors, isolation structures, and/or contacts (not shown for simplicity).

Embodiments of present invention further provide forming a bottom electrode layer 201 on top of the supporting structure 101 through, for example, a chemical-vapor-deposition (CVD) process, a physical vapor deposition (PVD) process, or an atomic-layer-deposition (ALD) process. The bottom electrode layer 201 may be, for example, a layer of titanium nitride and may be formed to have a thickness ranging from about 50 nm to about 100 nm, although the bottom electrode layer 201 may be made of other suitable materials and/or thicknesses, depending upon specific applications of the PCM device 10. For example, the bottom electrode layer 201 may be formed by one or more layers of materials such as tungsten (W), aluminum (Al), copper (Cu), titanium nitride (TiN), tantalum nitride (TaN), tungsten nitride (WN), doped polysilicon, cobalt silicide (CoSi), tungsten silicide (WSi) and other materials.

Figure 2:
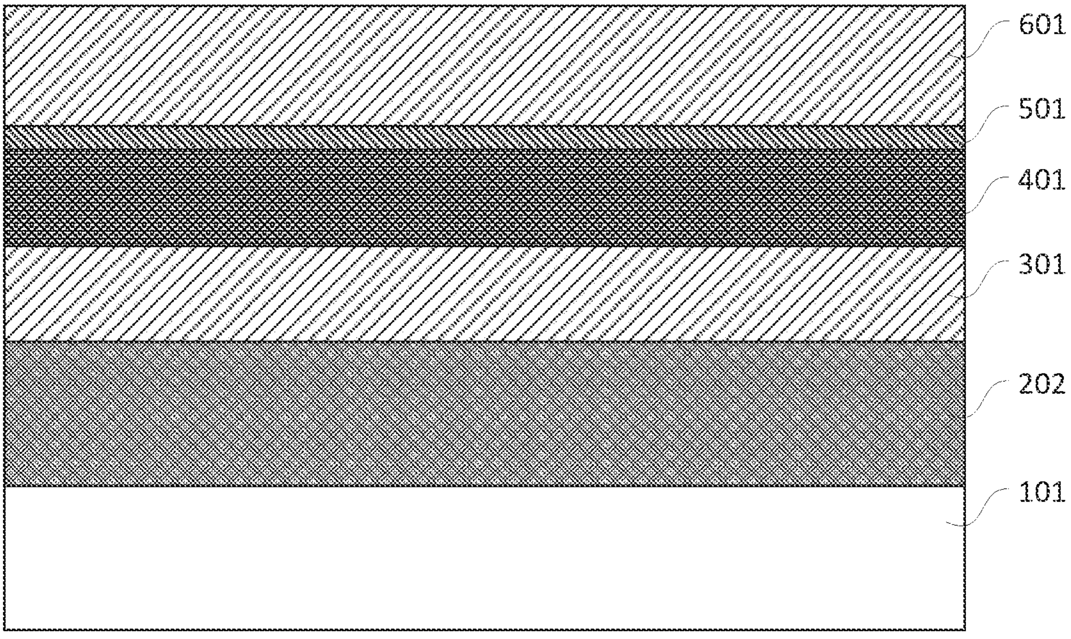
FIG. 2 is a demonstrative illustration of a cross-sectional view of a PCM device in a step of manufacturing thereof, following the step illustrated in FIG. 1, according to one embodiment of present invention.

FIG. 2 is a demonstrative illustration of a cross-sectional view of a PCM device in a step of manufacturing thereof, following the step illustrated in FIG. 1, according to one embodiment of present invention. More particularly, embodiments of present invention provide patterning the bottom electrode layer 201 into a bottom electrode 202. The bottom electrode 202 may be surrounded by or embedded in a dielectric material layer. In one embodiment, the bottom electrode 202 may be formed on top of a metal level (e.g., M2 or M3 level) or may itself be a part of a metal level (e.g., M2 or M3 level) in a BEOL structure. When being a part of a metal level such as a M2 or M3 level, the metal level itself may sometimes be referred to as a part of the PCM device 10 hereinafter solely for the convenience of reference. As is demonstratively illustrated in FIG. 2, the bottom electrode 202 may extend, for example, in a direction from left to right and the dielectric material layer that surrounds the bottom electrode 202 may be behind as well as in front of the bottom electrode 202, and thus not shown in FIG. 2.

Embodiments of present invention further provide forming a first blanket dielectric layer 301 on top of the bottom electrode 202 (and its surrounding dielectric material layer), a phase-change material layer 401 on top of the first blanket dielectric layer 301, a resistive liner layer 501 on top of the phase-change material layer 401, and a second blanket dielectric layer 601 on top of the resistive liner layer 501. The resistive liner layer 501 may be optional and when it is not used, the second blanket dielectric layer 601 may be formed directly on top of the phase-change material layer 401. The formation of the first blanket dielectric layer 301, the phase-change material layer 401, the resistive liner layer 501, and the second blanket dielectric layer 601 may be made through, for example, a CVD, PVD, or ALD process.

In one embodiment, the first and second blanket dielectric layers 301 and 601 may be any suitable dielectric material such as, for example, silicon nitride (SiN), boron nitride (SiB), silicon oxynitride (SiON), silicon boroncarbonitride (SiBCN), silicon oxycarbonitride (SiOCN), silicon carbonitride (SiCN), silicon oxycarbon (SiCO), or a combination thereof. The first and second blanket dielectric layers 301 and 601 may be formed independently to have independent thicknesses ranging, but not limited to, from about 10 nm to about 30 nm.

In another embodiment, the phase-change material layer 401 may be, for example, a layer of germanium-antimony-tellurium (GST), gallium-antimony-tellurium (GaST), or silver-iridium-antimony-telluride (AIST) material, although other suitable materials may be used as well. Examples of other suitable phase-change material may include, but not limited to, germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, Ge—Te alloys and combinations thereof. The phase-change material layer 401 may be undoped or may be doped with, for example, one or more elements such as, for example, oxygen (O), nitrogen (N), silicon (Si), and titanium (Ti).

Embodiments of the present invention provide forming a thin layer of conformally deposited phase-change material. For example, the phase-change material layer 401 may be formed to have a thickness thinner than that in a conventional PCM device, ranging from about 5 nm to about 30 nm, although other thicknesses may be possible as well. Using the thin layer of phase-change material creates a smaller volume of the phase-change material that need to be heated by a heating element (to be formed thereupon later) thereby reducing the time and/or energy needed, during operation of the PCM device, in order to transition the phase-change material from a high resistance amorphous phase or amorphous atomic structure to a low resistance crystalline phase or crystalline atomic structure. In other words, the smaller volume of phase-change material provides a faster phase transition because less heating and/or cooling is required to change the phase or state of the phase-change material (e.g., to change from an amorphous phase to a crystalline phase or vice-versa). By using a heating element with a thinner layer of phase-change material, embodiments of the present invention provide a PCM device with a semiconductor structure that allows faster transition of the phase-change material with improved functionality.

The resistive liner layer 501 may be a thin layer of resistive material whose resistivity may be higher than that of the phase-change material layer 401. Suitable material for the resistive liner layer 501 may include, for example, tantalum nitride (TaN), aluminum nitride (AlN), boron nitride (BN), aluminum oxide (AlO), tungsten nitride (WN), cobalt tungsten (CoW), nickel tungsten (NiW), yttrium oxide (YO), or alloys of these materials. Electrical resistance of the resistive liner layer 501 may be substantially greater than the resistance of the phase-change material layer 401 when the latter is in a low resistance state or crystalline state (e.g., ten to thirty or more times higher) but substantially lower than the resistance of the phase-change material layer 401 when the latter is in a high resistance state or amorphous state (e.g., five to twenty or more times lower).

Figure 3:
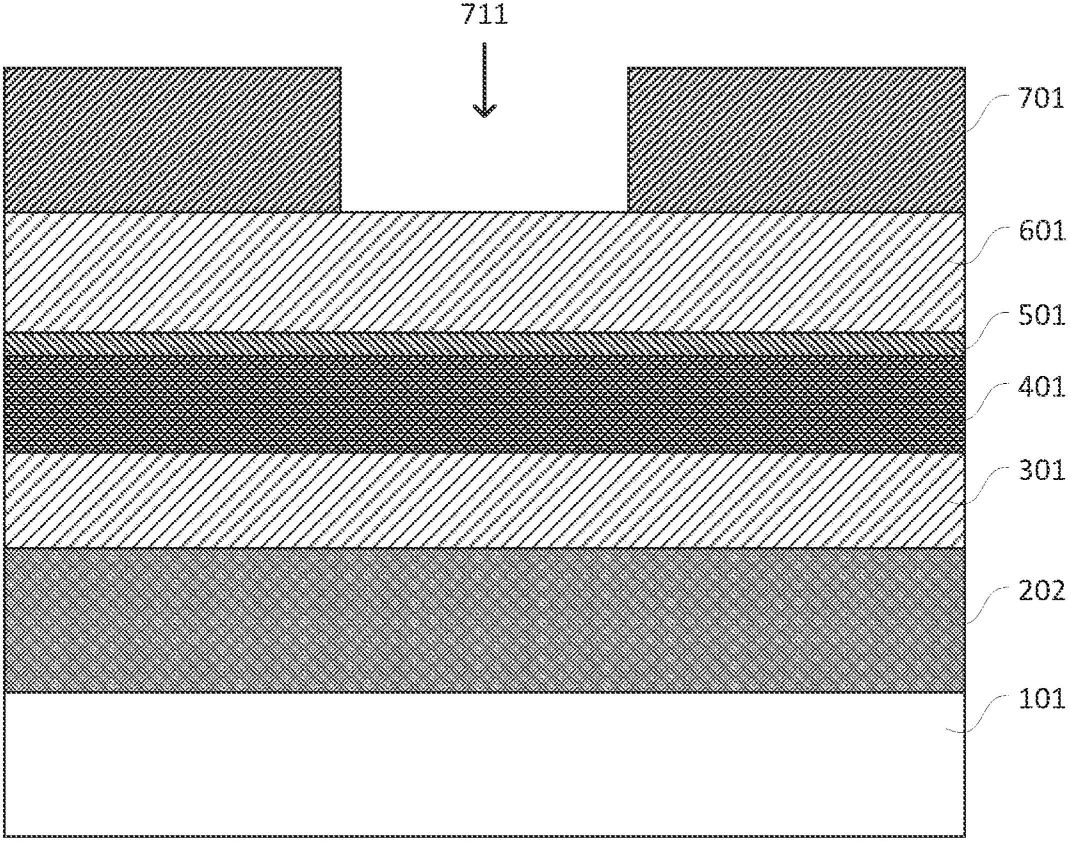
FIG. 3 is a demonstrative illustration of a cross-sectional view of a PCM device in a step of manufacturing thereof, following the step illustrated in FIG. 2, according to one embodiment of present invention.

FIG. 3 is a demonstrative illustration of a cross-sectional view of a PCM device in a step of manufacturing thereof, following the step illustrated in FIG. 2, according to one embodiment of present invention. More particularly, embodiments of present invention provide forming a hard mask 701 through, for example, a lithographic patterning process. The hard mask 701 may be formed to have a thickness ranging from about 30 nm to about 100 nm and patterned to have an opening 711 that exposes a top surface of the second blanket dielectric layer 601. In one embodiment, the opening 711 may be in a circular shape when being viewed from a top thereof. The hard mask 701 may be made of a dielectric material that may be same as or different from that of the second blanket dielectric layer 601.

Figure 4:
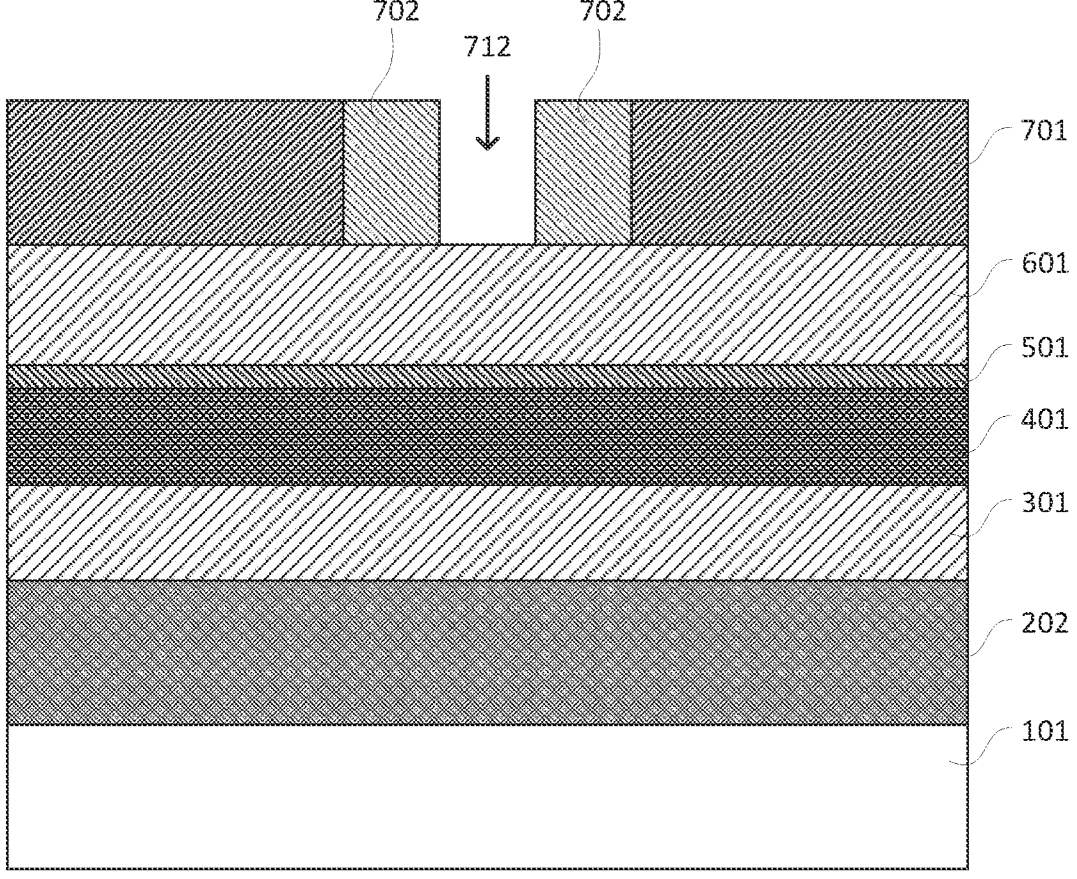
FIG. 4 is a demonstrative illustration of a cross-sectional view of a PCM device in a step of manufacturing thereof, following the step illustrated in FIG. 3, according to one embodiment of present invention.

FIG. 4 is a demonstrative illustration of a cross-sectional view of a PCM device in a step of manufacturing thereof, following the step illustrated in FIG. 3, according to one embodiment of present invention. More particularly, embodiments of present invention provide forming an inner spacer 702 at a sidewall of the opening 711 of the hard mask 701. For example, the inner spacer 702 may be formed by first depositing a conformal spacer layer. The conformal spacer layer may be made of a material such as, for example, SiN, SiB, SiON, SiBCN, SiOCN, SiCN, SiCO or other suitable materials, which lines the top surface of the hard mask 701 and sidewall of the opening 711. Subsequently, horizontal portions of the conformal spacer layer may be removed through an anisotropic and directional etching process such as a reactive-ion-etching (RIE) process, thereby resulting in the formation of an inner spacer 702. In one embodiment, the inner spacer 702 may be in a donut or ring shape when being viewed from a top thereof. The formation of the inner spacer 702 modifies the opening 711 into a modified opening 712. The inner spacer 702 has a substantially same horizontal thickness at sidewall of the opening 711 of the hard mask 701.

Figure 5:
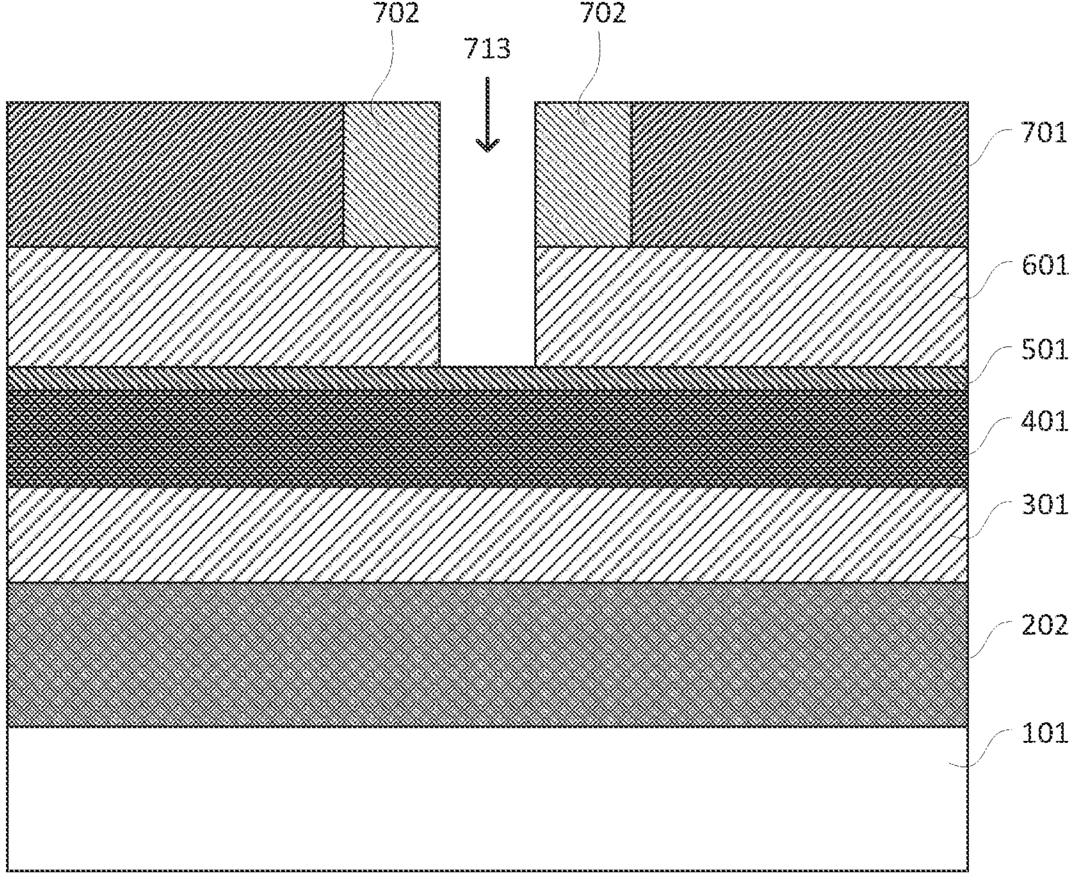
FIG. 5 is a demonstrative illustration of a cross-sectional view of a PCM device in a step of manufacturing thereof, following the step illustrated in FIG. 4, according to one embodiment of present invention.

FIG. 5 is a demonstrative illustration of a cross-sectional view of a PCM device in a step of manufacturing thereof, following the step illustrated in FIG. 4, according to one embodiment of present invention. More particularly, embodiments of present invention provide extending the modified opening 712 into the second blanket dielectric layer 601 to create an extended opening 713. Extending the modified opening 712 into the second blanket dielectric layer 601 may be made through, for example, an anisotropic etching process using the inner spacer 702 as an etch mask. The extended opening 713 may expose a top surface of the resistive liner layer 501 or directly expose a top surface of the phase-change material layer 401 when the resistive layer 501 is not used.

Figure 6:
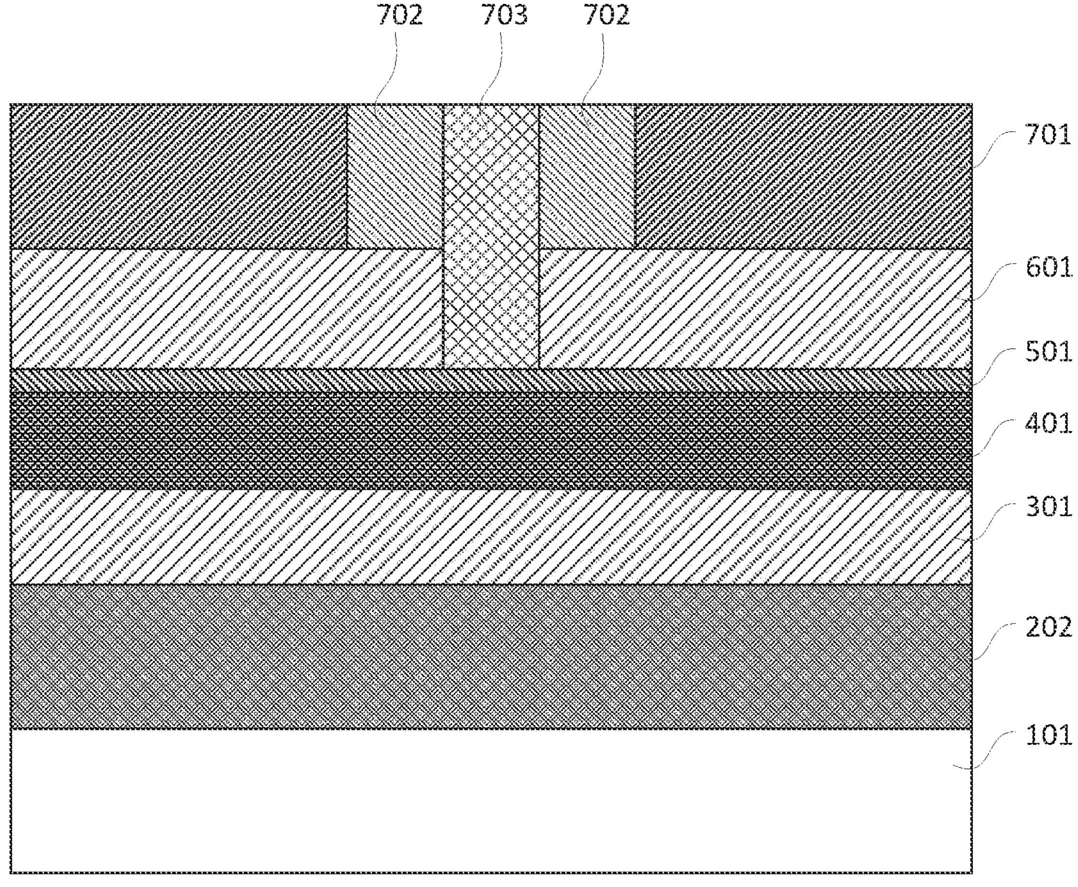
FIG. 6 is a demonstrative illustration of a cross-sectional view of a PCM device in a step of manufacturing thereof, following the step illustrated in FIG. 5, according to one embodiment of present invention.

FIG. 6 is a demonstrative illustration of a cross-sectional view of a PCM device in a step of manufacturing thereof, following the step illustrated in FIG. 5, according to one embodiment of present invention. More particularly, embodiments of present invention provide filling the extended opening 713 with a heating material to form a heating element 703. The heating element 703 may be formed through a conformal deposition process and may include one type of material such as, for example, TiN, or multiple layers of material such as, for example, TaN/TiN/TaN, etc. The heating element 703 is in direct contact with the underneath resistive liner layer 501 and/or directly with the phase-change material layer 401.

Figure 7:
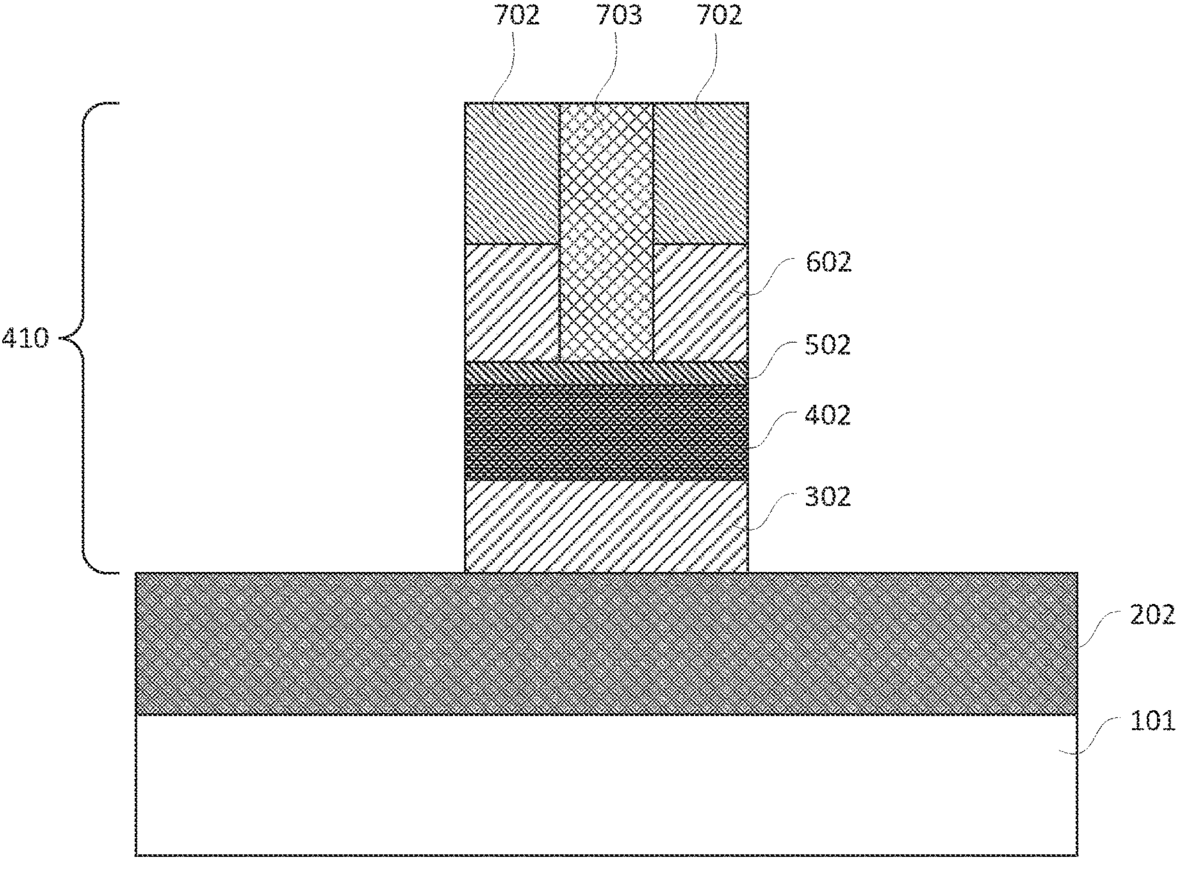
FIG. 7 is a demonstrative illustration of a cross-sectional view of a PCM device in a step of manufacturing thereof, following the step illustrated in FIG. 6, according to one embodiment of present invention.

FIG. 7 is a demonstrative illustration of a cross-sectional view of a PCM device in a step of manufacturing thereof, following the step illustrated in FIG. 6, according to one embodiment of present invention. More particularly, embodiments of present invention provide removing the hard mask 701 that surrounds the inner spacer 702 to expose the underneath second blanket dielectric layer 601. Embodiments of present invention may further include etching the second blanket dielectric layer 601 into a second dielectric layer 602, the underneath resistive liner layer 501 into a resistive liner 502, the underneath phase-change material layer 401 into a phase-change element 402, and the underneath first blanket dielectric layer 301 into a first dielectric layer 302, thereby forming a PCM stack 410. The above etching uses the inner spacer 702 and the heating element 703 as an etch mask. The PCM stack 410 includes outer sidewalls of the inner spacer 702 and the second dielectric layer 602, and sidewalls of the resistive liner 502, the phase-change element 402, and the first dielectric layer 302 that are substantially aligned with each other and with the outer sidewalls of the inner spacer 702 and the second dielectric layer 602. Using the inner spacer 702, which has a uniform thickness, and the heating element 703 as an etch mask ensures that the outer sidewall and inner sidewall of the second dielectric layer 602 are made concentric. Therefore, the heating element 703 may have a substantially equal horizontal distance to the outer sidewall of the second dielectric layer 602 as well as the sidewall of the phase-change element 402. In other words, the heating element 703 may be at a substantial center of the phase-change element 402 and may be formed to have equal horizontal distance to a conductive liner 803 formed later, as being described below in more details with reference to FIG. 12, that surrounds the phase-change element 402.

Figure 8:
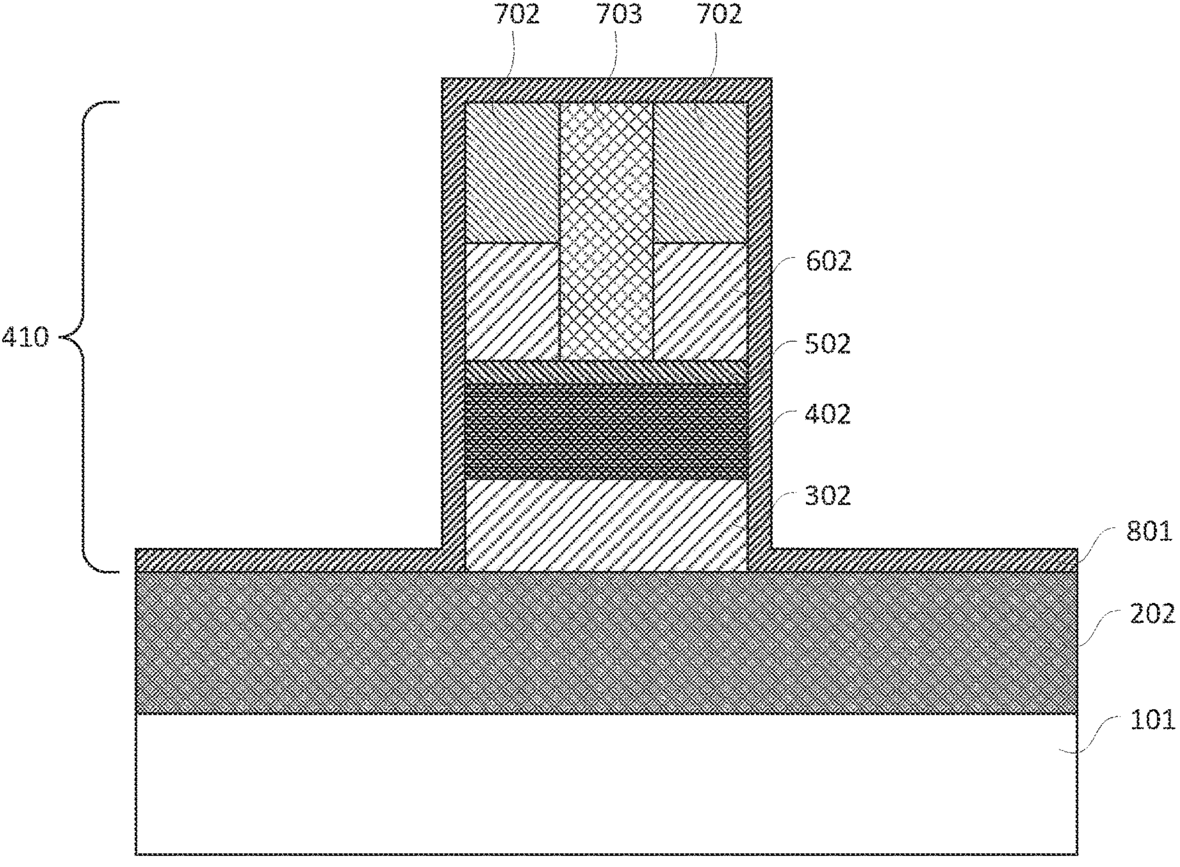
FIG. 8 is a demonstrative illustration of a cross-sectional view of a PCM device in a step of manufacturing thereof, following the step illustrated in FIG. 7, according to one embodiment of present invention.

FIG. 8 is a demonstrative illustration of a cross-sectional view of a PCM device in a step of manufacturing thereof, following the step illustrated in FIG. 7, according to one embodiment of present invention. More particularly, embodiments of present invention provide forming a conformal liner layer 801 covering the PCM stack 410. For example, the conformal liner layer 801 covers the heating element 703, the inner spacer 702, the second dielectric layer 602, the resistive liner 502, the phase-change element 402, the first dielectric layer 302, and the bottom electrode 202. The conformal liner layer 801 may be a conductive liner layer such as a metal liner layer of, for example, a TiN or other suitable conductive materials. The conformal liner layer 801 may be formed to have a thickness ranging from about 5 nm to about 20 nm but is not limited to these thicknesses.

Figure 9:
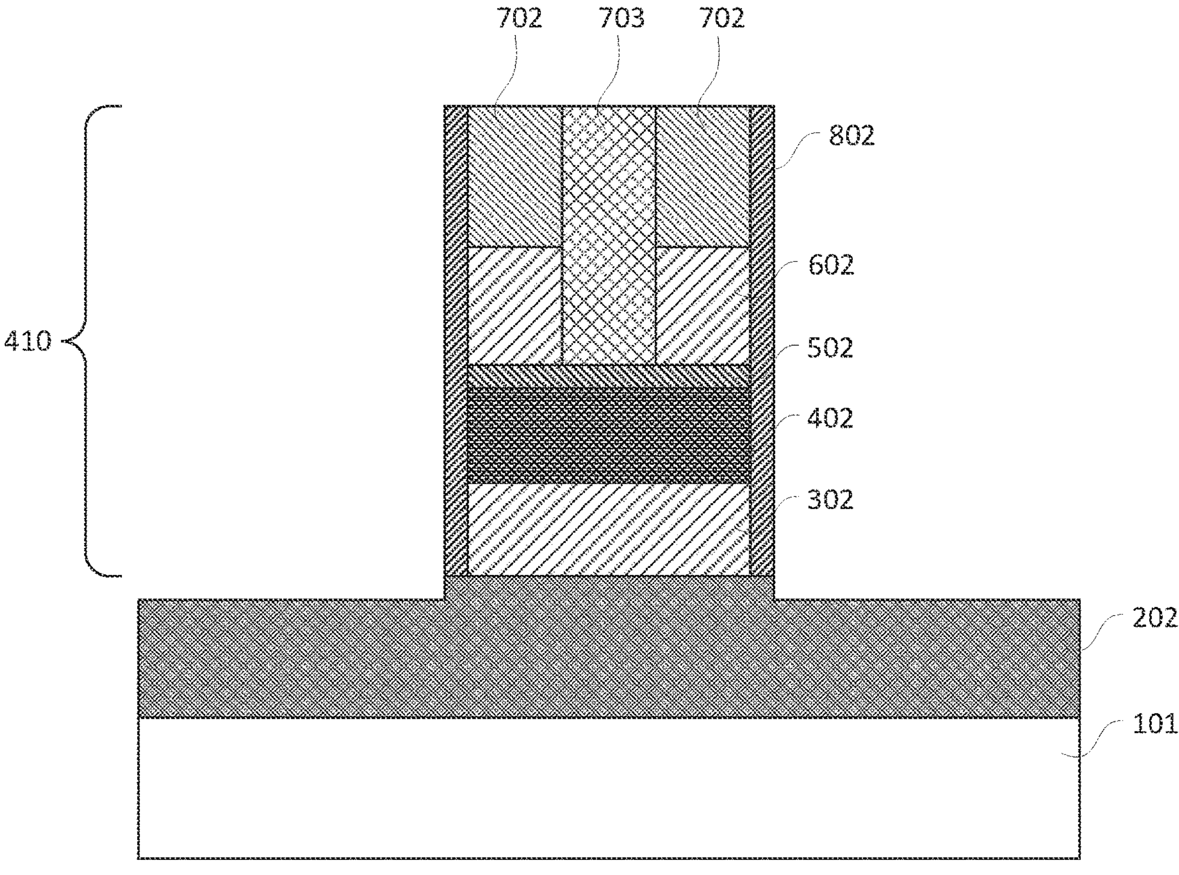
FIG. 9 is a demonstrative illustration of a cross-sectional view of a PCM device in a step of manufacturing thereof, following the step illustrated in FIG. 8, according to one embodiment of present invention.

FIG. 9 is a demonstrative illustration of a cross-sectional view of a PCM device in a step of manufacturing thereof, following the step illustrated in FIG. 8, according to one embodiment of present invention. More particularly, embodiments of present invention provide removing horizontal portions of the conformal liner layer 801 through an anisotropic etching process, such as a reactive-ion-etching (RIE) process. The anisotropic etching process is a directional etching process that removes portions of the conformal liner layer that covers a top surface of the PCM stack 410, which includes the top surfaces of the heating element 703 and the top surface of the inner spacer 702, and that covers top surface of the bottom electrode 202. The anisotropic etching process leaves a vertical portion 802 of the conformal liner layer 801 against a sidewall of the PCM stack 410. The sidewall of the PCM stack 410 includes sidewalls of the inner spacer 702, the second dielectric layer 602, the resistive liner 502, the phase-change element 402, and the first dielectric layer 302. In one embodiment, the anisotropic etching process may etch into the bottom electrode 202 and remove a top portion of the bottom electrode 202 as well.

Figure 10:
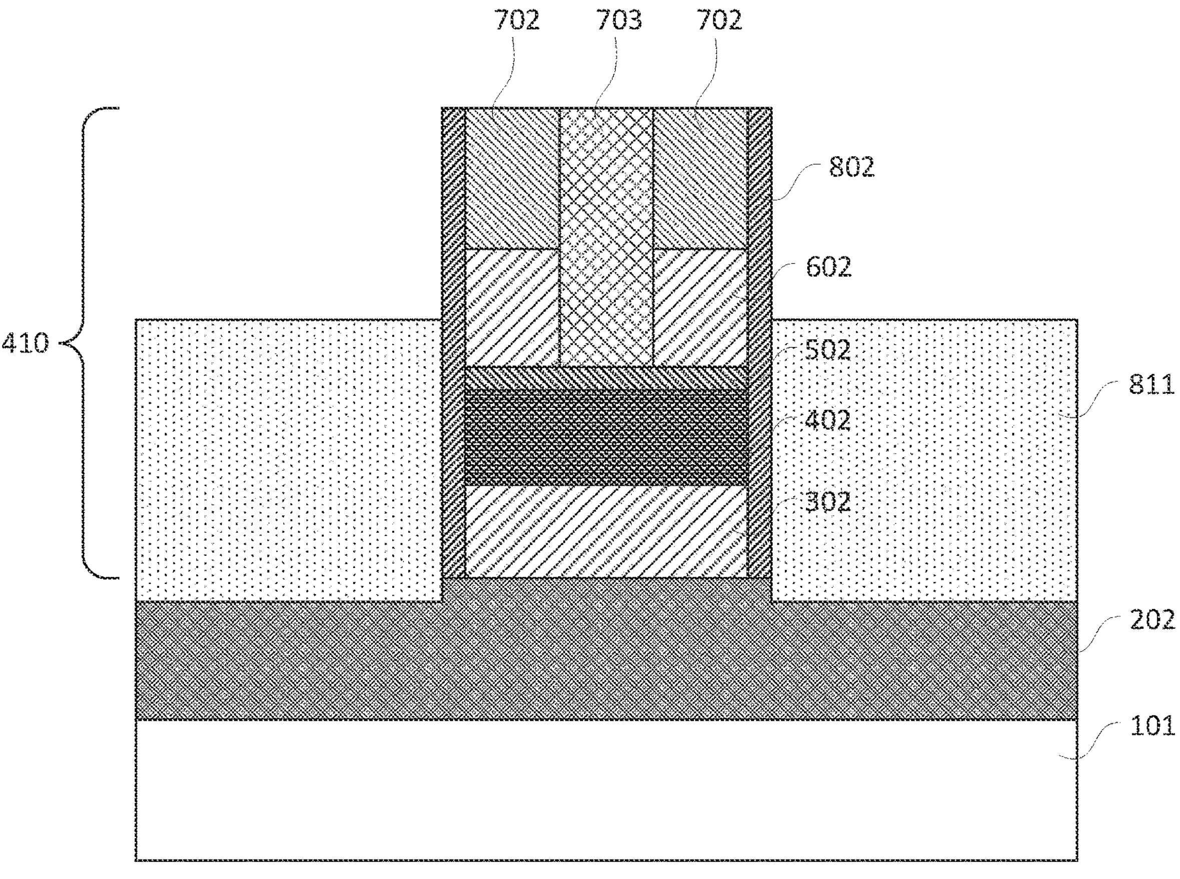
FIG. 10 is a demonstrative illustration of a cross-sectional view of a PCM device in a step of manufacturing thereof, following the step illustrated in FIG. 9, according to one embodiment of present invention.

FIG. 10 is a demonstrative illustration of a cross-sectional view of a PCM device in a step of manufacturing thereof, following the step illustrated in FIG. 9, according to one embodiment of present invention. More particularly, embodiments of present invention provide depositing a sacrificial layer 811 on top of the structure. The sacrificial layer 811 may be formed on top of the bottom electrode 202 and covers at least a portion of the vertical portion 802 of the conformal liner layer 801. For example, in one embodiment, an organic planarization layer (OPL) may be deposited to initially cover the entire PCM stack 410 and on top of the bottom electrode 202. In other words, the OPL may cover the top surfaces of the heating element 703 and inner spacer 702 and the vertical portion 802 of the conformal liner layer 801. The OPL may then be planarized through a chemical-mechanic-polishing (CMP) process to produce a flat top surface and subsequently recessed down to a level below the inner spacer 702 to form the sacrificial layer 811. In one embodiment, the sacrificial layer 811 may have a height whose level is below the inner spacer 702 but above the phase-change element 402 and the resistive liner 502.

Figure 11:
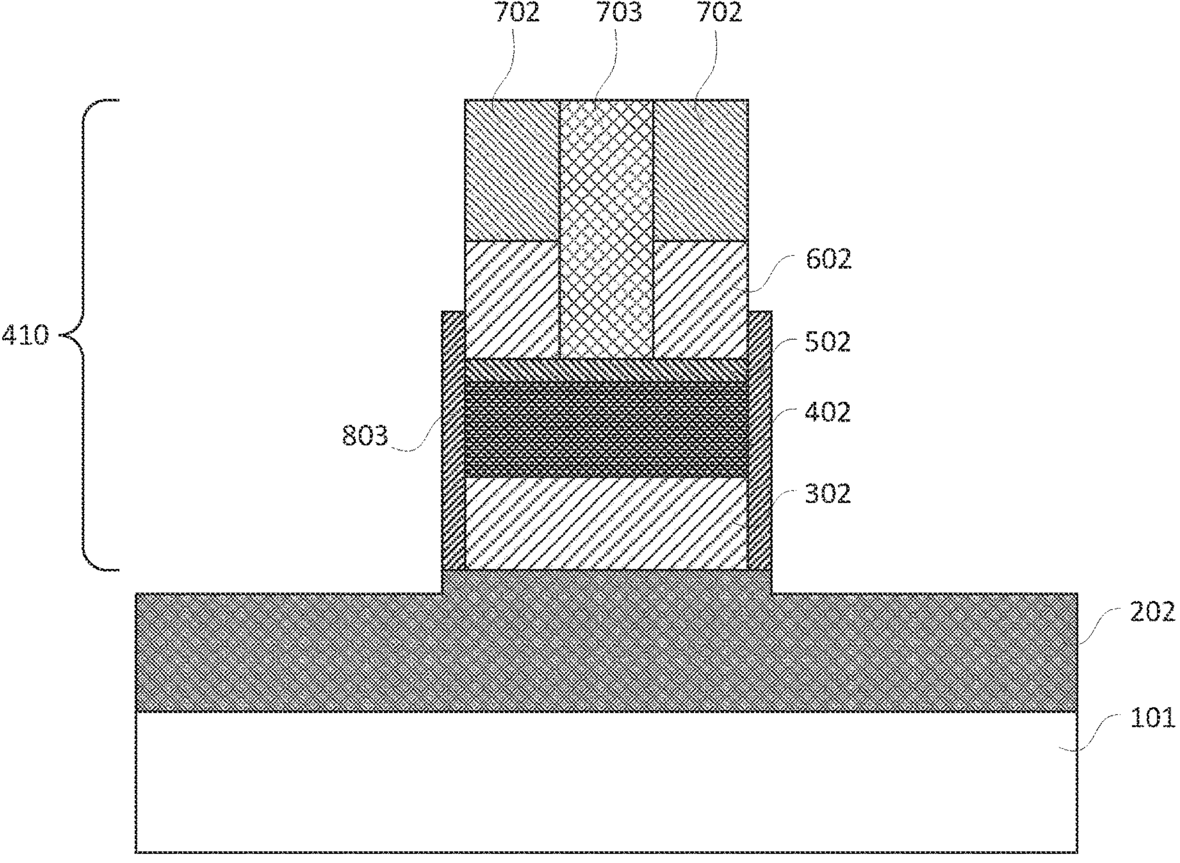
FIG. 11 is a demonstrative illustration of a cross-sectional view of a PCM device in a step of manufacturing thereof, following the step illustrated in FIG. 10, according to one embodiment of present invention.

FIG. 11 is a demonstrative illustration of a cross-sectional view of a PCM device in a step of manufacturing thereof, following the step illustrated in FIG. 10, according to one embodiment of present invention. More particularly, embodiments of present invention provide, with the sacrificial layer 811 covering and protecting the rest of the vertical portion 802 of the conformal liner layer 801, removing a portion of the vertical portion 802 of the conformal liner layer 801 that is above the sacrificial layer 811. The removal of the portion of the vertical portion 802 of the conformal liner layer 801 may be made through a selective etching process such as, for example, in a SC2 chemistry that contains a strong acid such as hydrochloric acid and hydrogen peroxide, resulting in a conductive liner 803 made from a remaining portion of the conformal liner layer 801. The conductive liner 803 covers the first dielectric layer 302, the phase-change element 402, the resistive liner 502, and at least a portion of the second dielectric layer 602. After the removal, embodiments of present invention provide selective removing the sacrificial layer 811 that surrounds the conductive liner 803.

Figure 12:
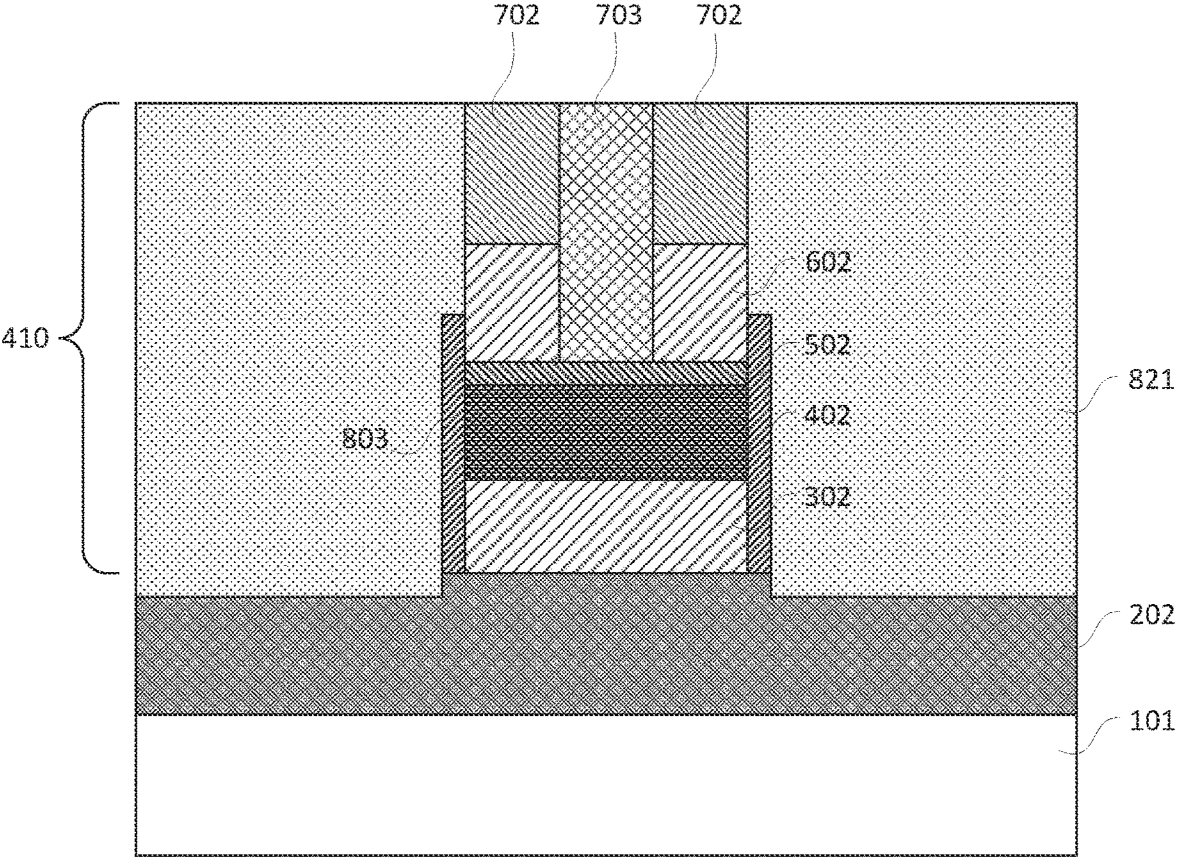
FIG. 12 is a demonstrative illustration of a cross-sectional view of a PCM device in a step of manufacturing thereof, following the step illustrated in FIG. 11, according to one embodiment of present invention.

FIG. 12 is a demonstrative illustration of a cross-sectional view of a PCM device in a step of manufacturing thereof, following the step illustrated in FIG. 11, according to one embodiment of present invention. More particularly, embodiments of present invention provide depositing a fourth dielectric layer 821 covering the PCM stack 410. For example, the fourth dielectric layer 821 may be formed next to the sidewall of the inner spacer 702, a portion of sidewall of the second dielectric layer 602, and to the conductive liner 803. In one embodiment, a top surface of the fourth dielectric layer 821 may be planarized to be coplanar with the top surfaces of the heating element 703 and the inner spacer 702.

Figure 13:
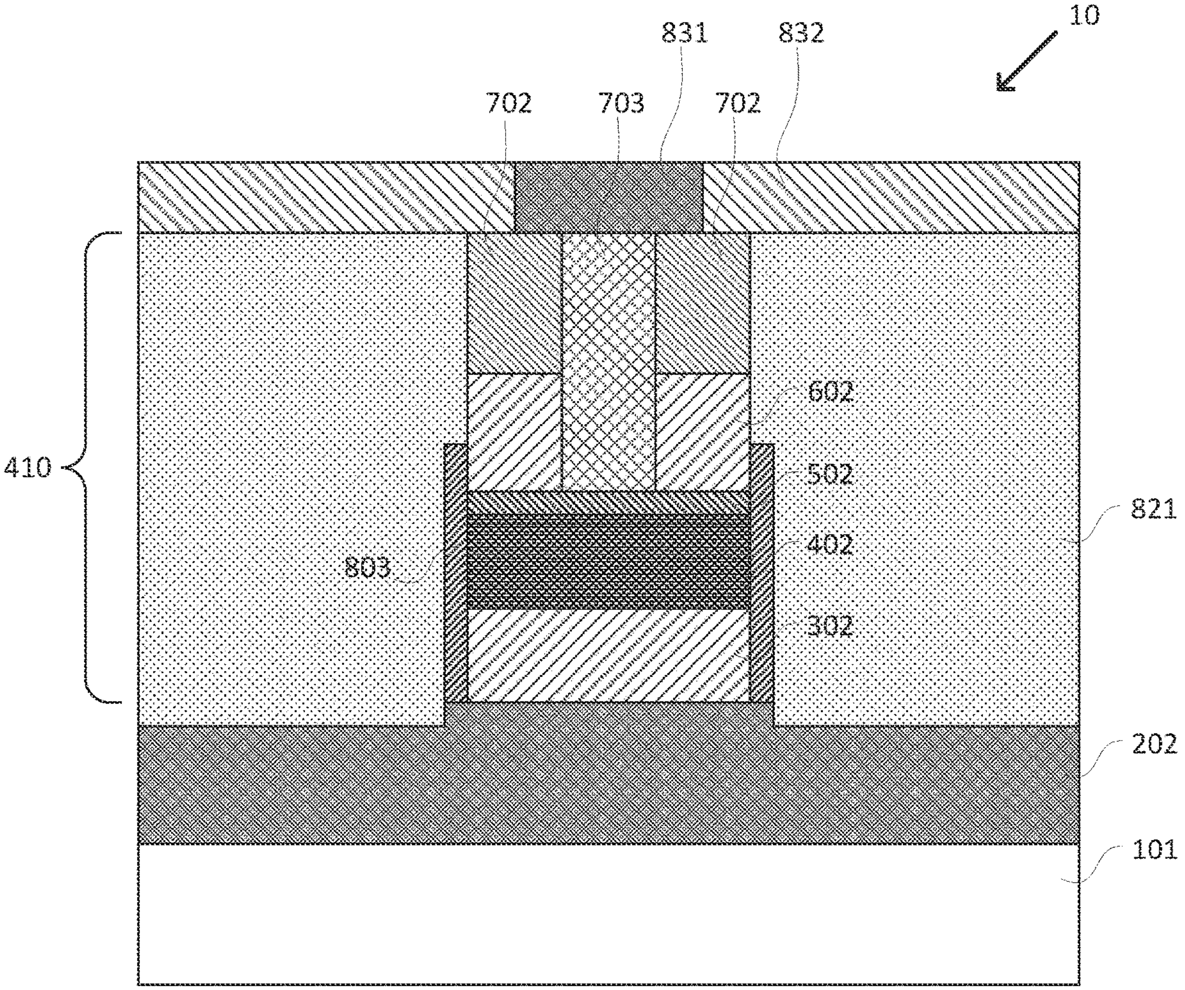
FIG. 13 is a demonstrative illustration of a cross-sectional view of a PCM device in a step of manufacturing thereof, following the step illustrated in FIG. 12, according to one embodiment of present invention.

FIG. 13 is a demonstrative illustration of cross-sectional view of a PCM device in a step of manufacturing thereof, following the step illustrated in FIG. 12, according to one embodiment of present invention. More particularly, embodiments of present invention provide forming a top electrode 831 on top of the heating element 703. For example, in one embodiment, a fifth dielectric layer 832 may be deposited on top of the PCM stack 410 and the fourth dielectric layer 821. An opening may be created in the fifth dielectric layer 832 to expose the top surface of the heating element 703 and the top electrode 831 may subsequently be deposited in the opening on top of the heating element 703. In another embodiment, a conductive material may first be deposited on top of the PCM stack 410 and subsequently patterned to form the top electrode 831. A dielectric layer may then be deposited to form the fifth dielectric layer 832 surrounding the top electrode 831.

In one embodiment, the bottom electrode 202 and the top electrode 831 may be two neighboring metal levels in a BEOL structure. For example, the bottom electrode 202 may be a metal level M and the top electrode 831 may be a metal level M+1. Metal level M and M+1 may extend in perpendicular directions such that the bottom electrode 202 (metal level M) may extend from left to right while the top electrode 831 (metal level M+1) may extend into and/or out of the paper in a direction perpendicular to the direction from left to right. Here, M may be a numerical number such as 2, 3, 4, etc. designating the metal level.

Figure 14A:
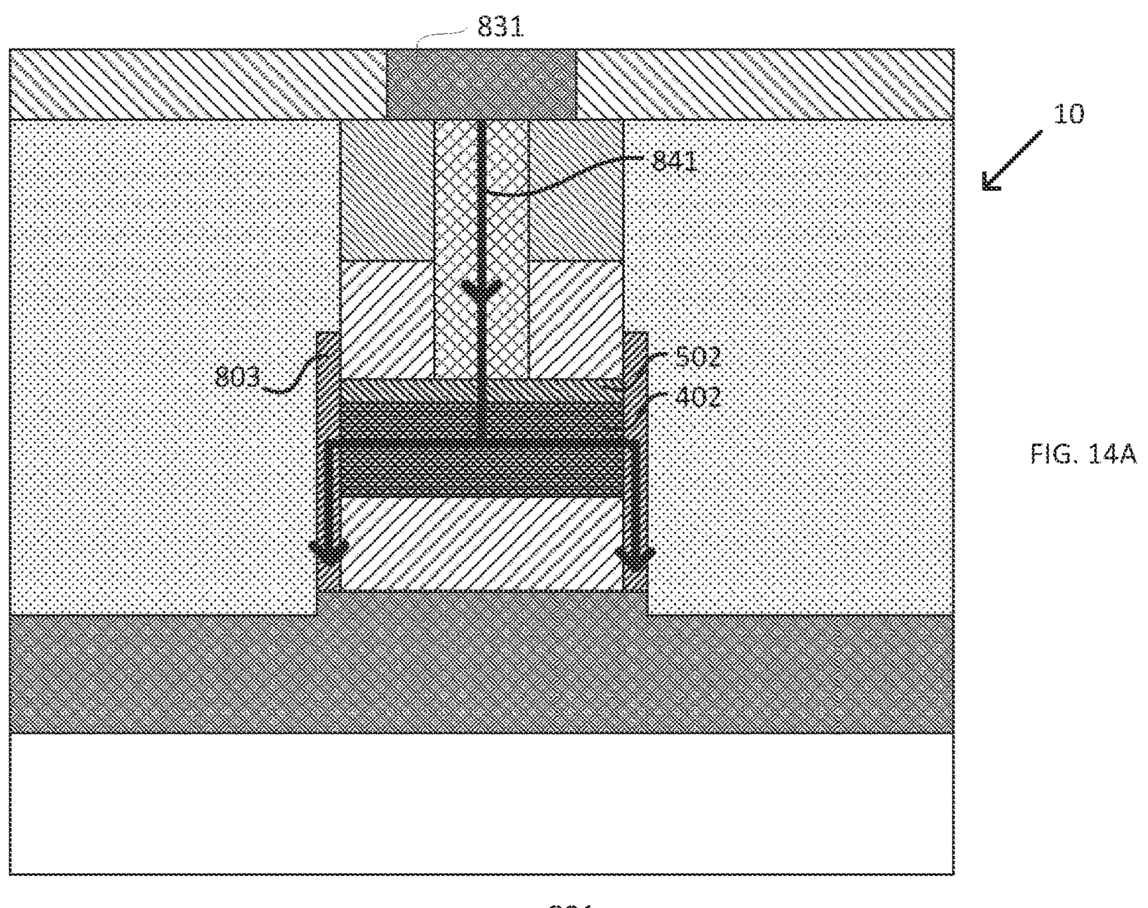
FIG. 14A and FIG. 14B are demonstrative illustrations of cross-sectional views of a PCM device during a SET state and a RESET state respectively according to one embodiment of present invention.
Figure 14B:
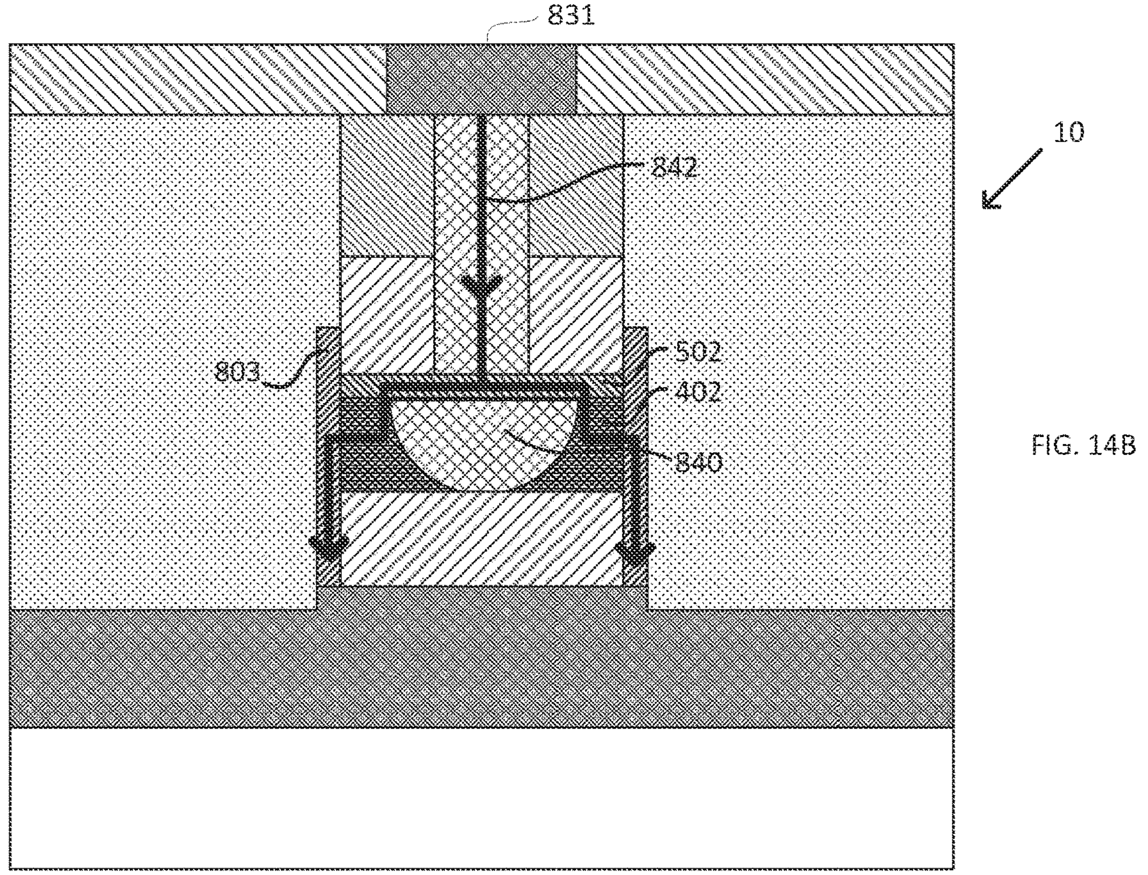

FIG. 14A and FIG. 14B are demonstrative illustrations of cross-sectional views of a PCM device during operation in a SET state and a RESET state respectively, according to various embodiments of present invention. More particularly, the PCM device 10 may include the resistive liner 502, as being described above, that may be deposited to have a thickness about a couple nanometers to ten nanometers. The resistive liner 502 may be formed to improve electrical function, such as mitigating resistance drift, of the phase-change element 402.

Resistance drift refers to a phenomenon where resistance of the phase-change element 402 of the PCM device 10 does not stay at a constant value after programming, particularly after a RESET operation when at least a switched region 840 of the phase-change element 402 is set to an amorphous state or phase. Because of that, the resistance of the phase-change element 402 changes as a function of time after programing.

In a SET state as is illustrated in FIG. 14A, the read current 841 coming from the heating element 703 may pass through the resistive liner 502 directly into the phase-change element 402 since the electrical resistance of the resistive liner 502 is substantially higher than that of the phase-change element 402 that is in a crystalline state or low resistance state. The read current 841 may continue to pass through the phase-change element 402 in a lateral direction, pass through the conductive liner 803, and eventually reach the bottom electrode 202.

In a RESET state as is illustrated in FIG. 14B, at least a portion of the phase-change element 402 such as the portion underneath the heating element 703 may be changed into an amorphous state. Because of that, the phase-change element 402 may exhibit a resistance drift over time and, when the resistive liner 502 is not present, the read current 842 may pass through the amorphous state of the phase-change element 402 that may have a changing electrical resistance that adversely affects the PCM device performance.

According to one embodiment of present invention, the resistive liner 502 may migrate this resistance drift. The resistance drift is mitigated by this resistive liner 502 as the resistive liner 502 shunts the read current 842 from the switched region 840 of the phase-change element 402 that are in amorphous state. With the resistive liner 502, the read current 842 may pass through the resistive liner 502 laterally, which is above the amorphous portion of the phase-change element 402 that has substantially higher electrical resistance than the resistive liner 502, onto the crystalline portion of phase-change element 402. In other words, the read current 842 bypasses the switched region 840 (in amorphous state) of the phase-change element 402, through the resistive liner 502, therefor exhibits stable electrical performance.

Figure 15:
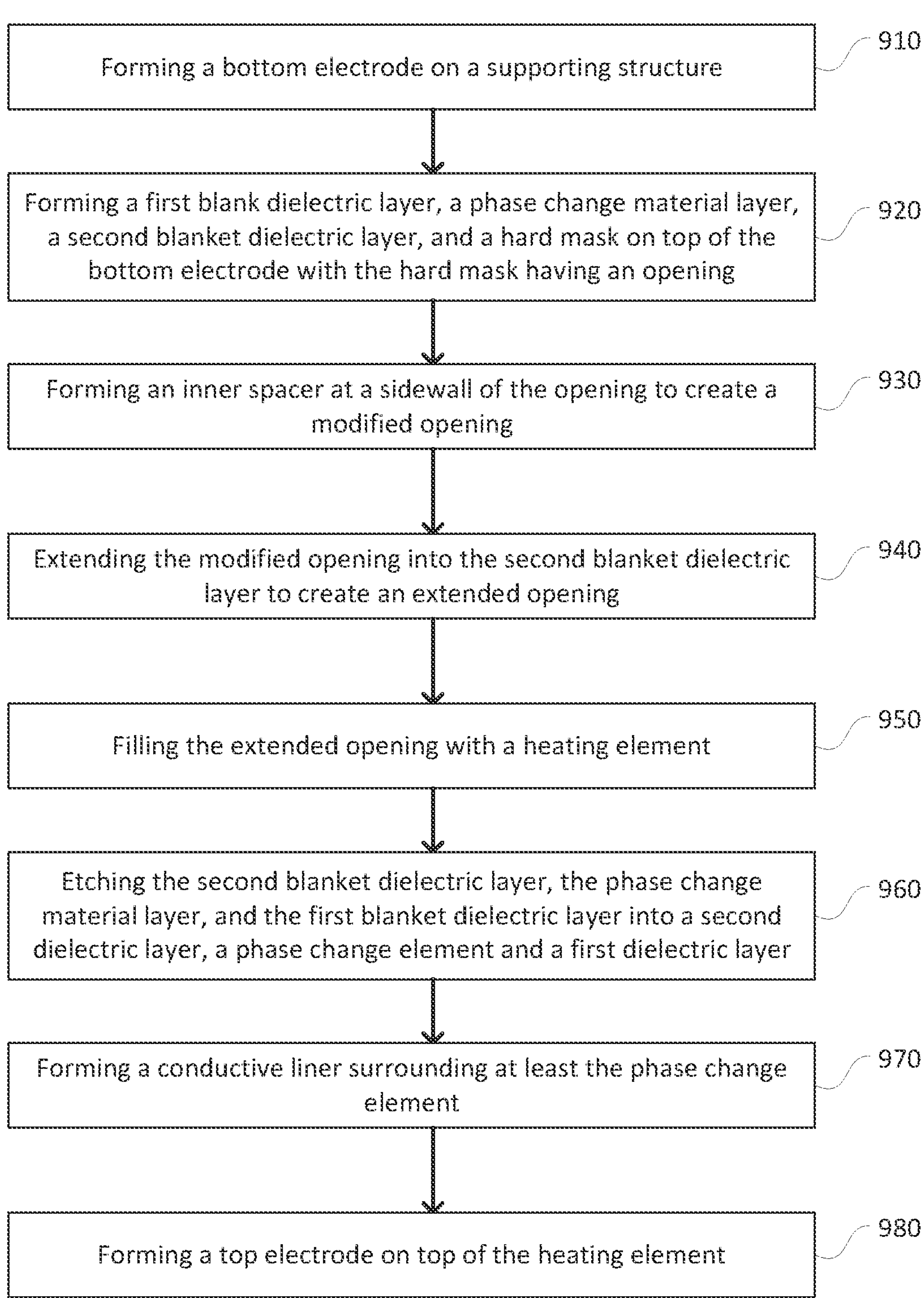
FIG. 15 is a demonstrative illustration of a flow-chart of a method of manufacturing a PCM device according to embodiments of present invention.

FIG. 15 is a demonstrative illustration of a flow-chart of a method of manufacturing a PCM device according to embodiments of present invention. The method includes (910) forming a bottom electrode on a supporting structure such as a substrate or a BEOL structure on top of a substrate; (920) forming a stack of layers including, from a bottom to a top thereof, a first blanket dielectric layer, a phase-change material layer, a second blanket dielectric layer, an optional resistive liner, and a hard mask on top of the bottom electrode, with the hard mask having an opening therein; (930) forming an inner spacer at a sidewall of the opening in the hard mask to modify the opening thereby creating a modified opening; (940) extending the modified opening into the second blanket dielectric layer to create an extended opening; (950) filling the extended opening with a heating material to form a heating element that is surrounded by the second blanket dielectric layer and the inner spacer; (960) removing the hard mask and etching the second blanket dielectric layer, the phase-change material layer, and the first blanket dielectric layer into a second dielectric layer, a phase-change element, and a first dielectric layer to form a PCM stack; (970) forming a conductive liner surrounding at least the phase-change element; and (980) forming a top electrode on top of the heating element.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A method of forming a phase change memory device, the method comprising:
- forming a bottom electrode on a supporting structure;
- forming a first blanket dielectric layer, a phase-change material layer, a second blanket dielectric layer, and a hard mask sequentially on top of the bottom electrode, the hard mask having an opening that exposes a portion of the second blanket dielectric layer;
- forming an inner spacer in the opening of the hard mask to create a modified opening;
- extending the modified opening into the second blanket dielectric layer to create an extended opening;
- filling the extended opening with a heating element;
- etching the second blanket dielectric layer, the phase-change material layer, and the first blanket dielectric layer respectively into a second dielectric layer, a phase-change element, and a first dielectric layer;
- forming a conductive liner surrounding at least the phase-change element; and
- forming a top electrode on top of the heating element.

2. The method of claim 1, wherein etching the second blanket dielectric layer, the phase-change material layer, and the first blanket dielectric layer comprises:
- removing the hard mask surrounding the inner spacer; and
- etching the second blanket dielectric layer, the phase-change material layer, and the first blanket dielectric layer to expose the bottom electrode in an anisotropic etching process by using the inner spacer and the heating element as an etch mask.

3. The method of claim 1, wherein extending the modified opening into the second blanket dielectric layer comprises etching the second blanket dielectric layer in an anisotropic etching process by using the inner spacer as an etch mask.

4. The method of claim 1, further comprising forming a resistive liner layer above the phase-change material layer before forming the second blanket dielectric layer, thereby the resistive liner layer being between the phase-change material layer and the second blanket dielectric layer.

5. The method of claim 1, wherein forming the inner spacer comprises:
- depositing a conformal spacer layer covering a top surface of the hard mask and a sidewall of the opening of the hard mask; and
- subsequently removing horizontal portions of the conformal spacer layer in an anisotropic etching process.

6. The method of claim 1, wherein forming the conductive liner comprises:
- forming a conductive liner layer covering a top surface of the heating element, a top surface of the inner spacer, a sidewall of the inner spacer, a sidewall of the second dielectric layer, a sidewall of the phase-change element, a sidewall of the first dielectric layer, and a top surface of the bottom electrode;
- removing horizontal portions of the conductive liner layer in an anisotropic etching process; and removing at least a portion of the conductive liner layer covering the sidewall of the inner spacer.

7. A method of forming a phase change memory device, the method comprising:

providing a bottom electrode;

forming a first blanket dielectric layer, a phase-change material layer, and a second blanket dielectric layer sequentially on top of the bottom electrode;

forming a hard mask on top of the second blanket dielectric layer, the hard mask having an opening that exposes the second blanket dielectric layer;

forming a conformal spacer layer covering a top surface of the hard mask and a sidewall of the opening of the hard mask;

removing horizontal portions of the conformal spacer layer to form an inner spacer against the sidewall of the opening;

using the inner spacer as an etch mask to etch the second blanket dielectric layer to create an extended opening; and filling the extended opening with a heating element.

8. The method of claim 7, further comprising forming a resistive liner layer above the phase-change material layer before forming the second blanket dielectric layer, thereby the resistive liner layer being between the phase-change material layer and the second blanket dielectric layer.

9. The method of claim 8, further comprising:

etching the second blanket dielectric layer, the resistive liner layer, the phase-change material layer, and the first blanket dielectric layer respectively into a second dielectric layer, a resistive liner, a phase-change element, and a first dielectric layer, wherein the heating element and the inner spacer are used as an etch mask in the etching; and forming a conductive liner vertically surrounding at least the resistive liner and the phase-change element.

10. The method of claim 9, wherein forming the conductive liner comprises:

forming a conductive liner layer covering the heating element, the inner spacer, the second dielectric layer, the resistive liner, the phase-change element, the first dielectric layer, and the bottom electrode;

removing horizontal portions of the conductive liner layer; and removing at least a portion of the conductive liner layer covering a sidewall of the second dielectric layer.

11. The method of claim 10, wherein the conductive liner is in contact with the resistive liner, the phase-change element, and the bottom electrode.

12. The method of claim 10, wherein the inner spacer is a third dielectric layer, further comprising forming a fourth dielectric layer, the fourth dielectric layer surrounding the conductive liner, an outer sidewall of the third dielectric layer, and at least a portion of the sidewall of the second dielectric layer.

13. The method of claim 7, further comprising:

forming an electrode material layer on top of a supporting structure; and patterning the electrode material layer into the bottom electrode.

14. The method of claim 7, wherein the inner spacer comprises a third dielectric material that is materially different from the second blanket dielectric layer and wherein the extended opening exposes the phase-change material layer on top of the first blanket dielectric layer.

* * * * *